United States Patent
Cho

(10) Patent No.: US 7,262,669 B2
(45) Date of Patent: Aug. 28, 2007

(54) CONTROL CIRCUIT FOR REFRESH OSCILLATOR

(75) Inventor: Jin Hee Cho, Cheongju-si (KR)

(73) Assignee: Hynix Semiconductor Inc., Kyoungki-Do (KR)

(*) Notice: Subject to any disclaimer, the term of this patent is extended or adjusted under 35 U.S.C. 154(b) by 155 days.

(21) Appl. No.: 11/158,344

(22) Filed: Jun. 22, 2005

(65) Prior Publication Data
US 2006/0146628 A1    Jul. 6, 2006

(30) Foreign Application Priority Data
Dec. 30, 2004   (KR) ............... 10-2004-0117051

(51) Int. Cl.
*H03L 7/85*    (2006.01)
(52) U.S. Cl. ............ 331/1 A; 331/57; 365/222; 365/225.7; 324/763
(58) Field of Classification Search ............ 324/763; 331/1 A, 57; 365/222, 225.7
See application file for complete search history.

(56) References Cited

U.S. PATENT DOCUMENTS 5,862,094 A * 1/1999 Kawabata et al. .......... 365/222

6,711,082 B1 * 3/2004 Loffler ...................... 365/222

FOREIGN PATENT DOCUMENTS

| JP | 11-039862 | 2/1999 |
|---|---|---|
| JP | 2004-206855 | 7/2004 |
| JP | 2005-342862 | 12/2005 |
| KR | 1020000066536 | 11/2000 |

* cited by examiner

*Primary Examiner*—Arnold Kinkead
(74) *Attorney, Agent, or Firm*—Lowe Hauptman & Berner LLP

(57) ABSTRACT

The present invention relates to a circuit for controlling a refresh oscillator, and more specifically, to a circuit for controlling a refresh oscillator, wherein refresh characteristics can be tested in a more efficient manner in such a manner that the refresh characteristics are tested at a refresh cycle, which is extended as long as a predetermined time from an originally set refresh cycle, in a user test mode so as to measure a refresh margin over a wide temperature range.

11 Claims, 10 Drawing Sheets

CONTROL CIRCUIT FOR REFRESH OSCILLATOR

BACKGROUND

1. Field of the Invention

The present invention relates to a circuit for controlling a refresh oscillator, and more specifically, to a circuit for controlling a refresh oscillator, wherein refresh characteristics can be tested in a more efficient manner in such a manner that the refresh characteristics are tested at a refresh cycle, which is extended as long as a predetermined time from an originally set refresh cycle, in a user test mode so as to measure a refresh margin over a wide temperature range.

2. Discussion of Related Art

In DRAM devices, stored data are lost after a predetermined time elapses. In order to guarantee data retention characteristics, an operation of refreshing the stored data by activating a bit line sense amplifier is performed. In order to guarantee the operating cycle of self refresh, wherein the refresh operation is automatically repeated after a predetermined time elapses during the refresh operation, a self-refresh oscillator is used. The self-refresh oscillator generates a signal of a given cycle, and uses the signal to decide a self-refresh cycle.

Meanwhile, DRAM devices undergo a variety of tests at a wafer and package level so as to determine whether they meet AC/DC specifications of a product in the process of mass production. Of them, the refresh characteristic test is very important, test methods for various refresh characteristics have been used. More particularly, in case of a low-power DRAM used for mobile products, etc. a temperature compensation self refresh (TCSR) method in which the refresh current is reduced with different refresh cycles depending upon temperature characteristics is used. In a wide temperature range, refresh characteristics have to be tested. Accordingly, in order to change the refresh cycle according to temperature, an oscillator whose cycle is changed according to temperature, a method of controlling the division number, and the like have been employed.

FIG. 17 shows a circuit for controlling the refresh oscillator in the prior art.

An oscillation signal generation circuit 11 generates an oscillation signal OSC depending upon a basic refresh cycle if a refresh signal SRF is generated according to an externally applied refresh command. The oscillation signal OSC is output with its level changed on the basis of an internal signal delay time within the oscillation signal generation circuit 11 as a cycle. A reset circuit 12 uses a refresh signal SRF and a refresh cycle signal PSRF to output a delay signal SRFDD, a first reset signal CRST and a second reset signal ORST being a refresh signal. Whenever the refresh signal SRF is applied as a high level and the refresh cycle signal PSRF is applied as a pulse of a high level, the reset circuit 12 outputs the first reset signal CRST and the second reset signal ORST of a high level. At this time, the first reset signal CRST initializes a divider circuit 14, and the second reset signal CRST initializes the oscillation signal generation circuit 11.

A clock signal generation circuit 13 generates a signal JDG having the same phase as that of the oscillation signal OSC and a clock signal CLK having an opposite phase to that of the oscillation signal OSC according to the refresh signal SRF and the oscillation signal OSC.

The divider circuit 14 is initialized according to the first reset signal CRST, and generates divider signals RCA<0:3> that are increased depending upon dividers 14a to 14d according to clock signals CLK. For example, a first divider 14a can output the divider signal RCA<0> of one cycle according to two cycles of the clock signal CLK. A second divider 14b can output the divider signal RCA<1> of one cycle according to two cycles of the output signal RCA<0> of the first divider 14a.

A fuse set circuit 15 consists of a fuse. It outputs a plurality of fuse signals FUS<0:3> for deciding the refresh cycle depending upon a power-up signal PUPB and a cutting state of the fuse. For example, when the fuse signal FUS<0> is a high level, the refresh cycle is set to 1 division. When the fuse signal FUS<1> is a high level, the refresh cycle is set to 2 division. When the fuse signal FUS<2> is a high level, the refresh cycle is set to 4 division. When the fuse signal FUS<3> is a high level, the refresh cycle is set to 8 division. A greater number of divisions can be set according to an output combination of the fuse signals FUS<0:3>.

A refresh cycle signal generation circuit 16 compares the divider signals RCA<0:3> and the output signals FUS<0:3> of the fuse set circuit according to a delayed refresh signal SREDD. If the divider signals RCA<0:3> and the output signals FUS<0:3> of the adder are identical to each other, a refresh cycle signal PSRF is output as a high level at a rising edge of the signal JDG.

However, the refresh cycle is not always constant, but has some variation in width depending upon variation in a process condition, an operating voltage and temperature. FIG. 15 shows a refresh time of a chip depending upon variation in temperature. The refresh time has an inverse proportion to temperature, i.e., the higher temperature, the greater the refresh time tREF. At this time, tREFM is the refresh time of a chip, and refers to the characteristics of the chip. As indicated by A in FIG. 15, in the case where refresh is performed at a cycle of tREF=OSC1, there is no problem in refresh since the cycle is shorter than that of tREFM. In the event that refresh is performed at a cycle of tREF=OSC2 as indicated by B in FIG. 5, a chip can be passed or failed depending upon variation in the cycle of an oscillator because the refresh time is some of the characteristic value of the chip. Accordingly, in order to prevent problems from occurring, it is necessary to test refresh characteristics with sufficient margin by predicting change in a refresh cycle depending upon variation in process condition, operating voltage, temperature, etc. of a chip in the case where the refresh characteristic is tested.

SUMMARY OF THE INVENTION

Accordingly, the present invention has been made in view of the above problems, and it is an object of the present invention to provide a circuit for controlling a refresh oscillator, wherein refresh characteristics can be tested in an efficient manner in such a manner that a user test mode is set in order to test a refresh margin over a wide temperature range, and the user test mode is set to have a refresh cycle which is extended for a predetermined time from an original refresh cycle of a chip.

Another object of the present invention is to provide a circuit for controlling a refresh oscillator, wherein chip located at the boundary of a refresh characteristic value tREFM can be screened in such a way that a user test mode is set to have a refresh cycle which is extended for a predetermined time from an original refresh cycle of a chip.

In the present invention, considering a refresh cycle that varies according to variation in a process condition, an operating voltage, a temperature, etc., if a user test mode is enabled, the refresh cycle is set to be longer than an original refresh cycle time [tREF OSC1 or OSC2] of a chip for a predetermined time by changing the division number for controlling a refresh cycle set in a fuse set circuit. That is, as shown in FIG. 16, a chip is tested in a state where the refresh cycle has a refresh margin of Δ tREF by performing refresh so that the refresh cycle time becomes tREF=tREF OSC1 or OSC2+Δ tREF. It is thus possible to screen chips located at the boundary of the refresh characteristic value tREFM.

To achieve the above objects, according to an embodiment of the present invention, there is provided a circuit for controlling a refresh oscillator, including an oscillation signal generation circuit for generating an oscillation signal depending upon a basic oscillation cycle, according to a refresh signal generating when a refresh command is issued, a clock signal generation circuit for generating a first clock signal having the same phase as that of the oscillation signal and a second clock signal having an opposite phase to that of the oscillation circuit, according to the refresh signal and the oscillation signal, a divider circuit having a plurality of dividers, for sequentially counting a plurality of divider signals, and generating the divider signals that increases in a sequential manner, according to the second clock signal, a fuse set circuit having a fuse, for generating a plurality of fuse signals for deciding a refresh cycle, according to a cutting state of the fuse, a control circuit for outputting a control signal depending upon the fuse signal, according to a test mode enable signal, an adder for outputting a plurality of output signal depending upon the fuse signals, according to the control signal, and a refresh cycle signal generation circuit for comparing the plurality of the divider signals and the plurality of the output signals of the adder, respectively, and if the divider signals and the output signals of the adder, generating a refresh cycle signal whenever the first control signal is generated.

The circuit can further includes a reset circuit, which is enabled according to the refresh signal, and generates a first reset signal for initializing the divider circuit and a second reset signal for initializing the oscillation signal generation circuit whenever the refresh cycle signal is applied.

The oscillation signal generation circuit can be initialized according to the second reset signal, and can generate the oscillation signal whose level is changed using an internal signal delay time as a cycle, according to the refresh signal.

The divider circuit can include a plurality of dividers that are initialized according to the first reset signal, and can sequentially count the plurality of the divider signals and generate the plurality of the divider signals that increase sequentially, according to the second clock signal.

The control circuit can output first and second control signals of a low level regardless of the fuse signals in a normal mode in which the test mode enable signal is disabled, and can output the first control signal having an opposite phase as that of the fuse signals and the second control signal having the same phase as that of the fuse signals in a test mode in which the test mode enable signal is enabled.

The adder can output the output signals having the same phase as that of the fuse signals in a normal mode, and output the output signals having an opposite phase to that of the fuse signals in a test mode.

The refresh cycle signal generation circuit can compare the plurality of the divider signals and the plurality of the output signals of the adder, respectively, in a test mode, and if the divider signals and the output signals of the adder are the same, generate a refresh cycle signal having a greater refresh cycle than that set by the fuse set circuit whenever the first control signal is generated.

The refresh cycle signal generation circuit can include a plurality of EOR gates for performing an EOR operation on the plurality of the divider signals and the plurality of the output signals of the adder, respectively, a first NOR gate for performing a NOR operation on the output signals of the plurality of the EOR gates, a NAND gate for performing a NAND operation on the output signal of the NOR gate and the first control signal, and a second NOR gate for performing a NOR operation on an inverted signal of the refresh signal and a delay signal of the output signal of the NAND gate to generate the refresh cycle signal.

According to another embodiment of the present invention, there is provided a circuit for controlling a refresh oscillator, including an oscillation signal generation circuit for generating an oscillation signal depending upon a basic oscillation cycle, according to a refresh signal generating when a refresh command is issued, a clock signal generation circuit for generating a first clock signal having the same phase as that of the oscillation signal and a second clock signal having an opposite phase to that of the oscillation circuit, according to the refresh signal and the oscillation signal, a divider circuit having a plurality of dividers, for sequentially counting a plurality of divider signals, and generating the divider signals that increases in a sequential manner, according to the second clock signal, a fuse set circuit having a fuse, for generating a plurality of fuse signals for deciding a refresh cycle, according to a cutting state of the fuse, and a refresh cycle signal generation circuit for comparing a test mode enable signal and a fuse signal, and the plurality of the divider signals, respectively, and if the divider signals and the output signals of the adder are the same, generating a refresh cycle signal having a greater refresh cycle than that set by the fuse set circuit whenever the first control signal is generated in a test mode.

The divider circuit can generate the divider signals whose number is one greater than the number of the fuse signals of the fuse set circuit.

The refresh cycle signal generation circuit can includes an first EOR gate for performing an EOR operation on the test mode enable signal and the divider signals, a plurality of second EOR gates for performing an EOR operation on the remaining divider signals and the fuse signals, respectively, a first NOR gate for performing a NOR operation on the output signals of the plurality of the EOR gates, a NAND gate for performing a NAND operation on the output signal of the NOR gate and the first control signal, and a second NOR gate for performing a NOR operation on an inverted signal of the refresh signal and a delay signal of the output signal of the NAND gate to generate the refresh cycle signal.

DETAILED DESCRIPTION OF PREFERRED EMBODIMENTS

Now, the preferred embodiments according to the present invention will be described with reference to the accompanying drawings.

Figure 1:
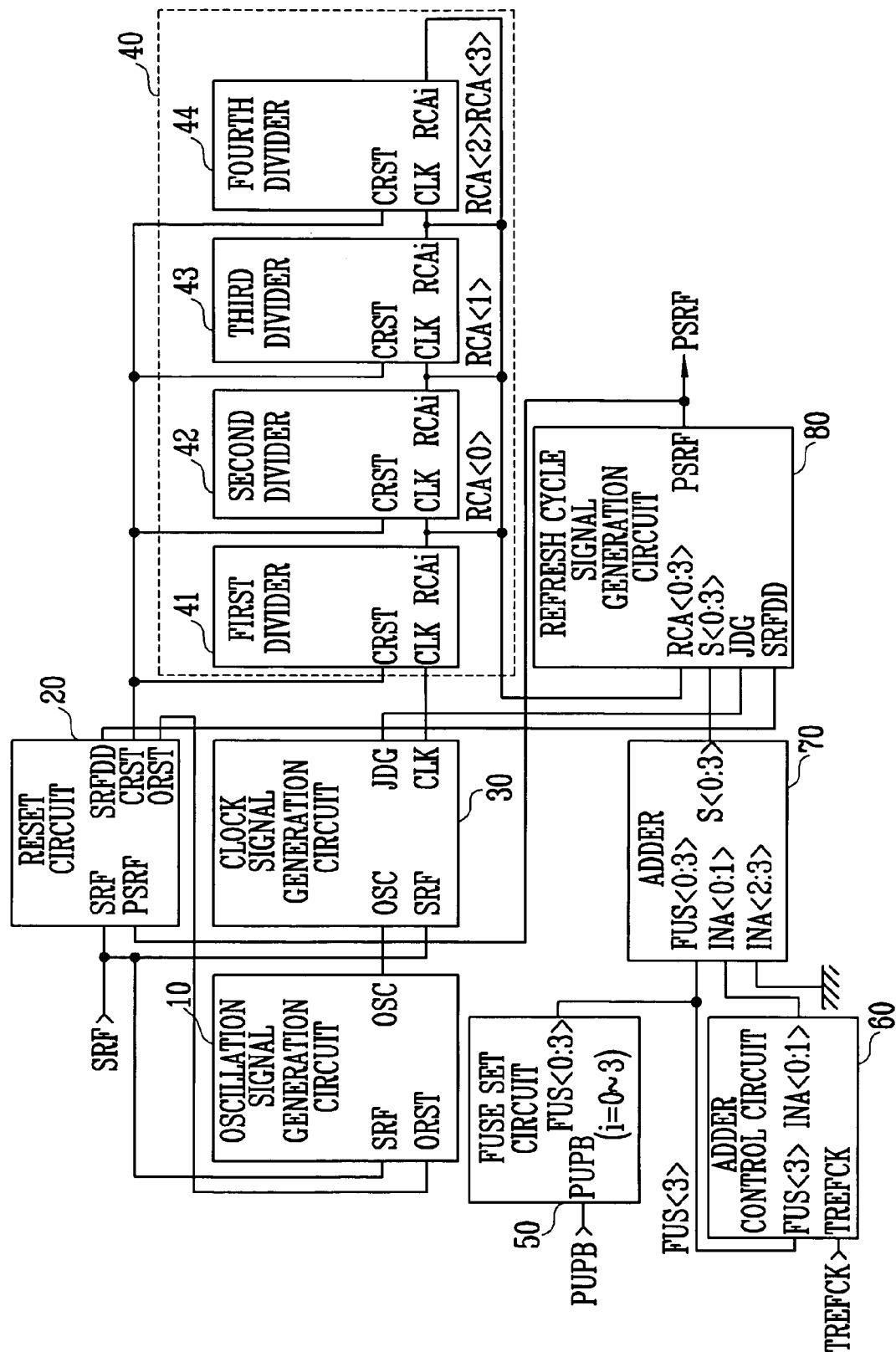
FIG. 1 is a block diagram of a circuit for controlling a refresh oscillator according to an embodiment of the present invention.

FIG. 1 is a block diagram of a circuit for controlling a refresh oscillator according to an embodiment of the present invention.

The oscillation signal generation circuit 10 generates an oscillation signal OSC according to a basic refresh cycle, if a refresh command is applied from the outside and a refresh signal SRF is generated accordingly. The oscillation signal OSC is output with its level changed using a signal delay time within the oscillation signal generation circuit 10 as a cycle.

A reset circuit 20 uses the refresh signal SRF and a refresh cycle signal PSRF to generate a delay signal SRFDD of the refresh signal, a first reset signal CRST and a second reset signal ORST. Whenever the refresh signal SRF is applied as a pulse of a high level and the refresh cycle signal PSRF is applied as a pulse of a high level, the reset circuit 20 outputs the first reset signal CRST and the second reset signal ORST of a high level. At this time, the first reset signal CRST initializes a divider circuit 40, and the second reset signal CRST initializes the oscillation signal generation circuit 10.

A clock signal generation circuit 30 generates a signal JDG having the same phase as the oscillation signal OSC and a clock signal CLK having an opposite phase to the oscillation signal OSC according to the refresh signal SRF and the oscillation signal OSC.

A divider circuit 40 is initialized according to the first reset signal CRST, and generates divider signals RCA<0:3> that increase according to dividers 41 to 44, according to the clock signal CLK. For example, the first divider 41 can output the divider signal RCA<0> of one cycle according to two cycles of the clock signal CLK. The second divider 42 can output the divider signal RCA<1> of one cycle according to two cycles of the output signal RCA<0> of the first divider 41. The third divider 43 can output of one cycle according to two cycles of the output signal RCA<1> of the second divider 42. The fourth divider 44 can output the divider signal RCA<3> of one cycle according to two cycles of the output signal RCA<2> of the third divider 43.

A fuse set circuit 50 consists of a fuse, and outputs a plurality of fuse signals FUS<0:3> for deciding the refresh cycle according to a power-up signal PUPB and a cutting state of the fuse. For example, if the fuse signal FUS<0> is a high level, the refresh cycle can be set to 1 division. If the fuse signal FUS<1> is a high level, the refresh cycle can be set to 2 division. If the fuse signal FUS<2> is a high level, the refresh cycle can be set to 4 division. If the fuse signal FUS<3> is a high level, the refresh cycle can be set to 8 division. A greater number of divisions can be set according to the output combination of the fuse signals FUS<0:3>.

An adder control circuit 60 outputs adder control signals INA<0:1> depending upon the output signal FUS<3> of the fuse set circuit 50 according to a test mode enable signal TREFCK. In a normal mode, the adder control circuit 60 outputs the adder control signals INA<0:1> of a low level regardless of the fuse signal FUS<3> of the fuse set circuit 50. In a test mode, the adder control circuit 60 outputs the adder control signal INA<0> having an opposite phase to that of the fuse signal FUS<3> of the fuse set circuit 50, and the adder control signal INA<1> having the same phase as that of the fuse signal FUS<3> of the fuse set circuit 50.

An adder 70 outputs signals S<0:3> according to the adder control signals INA<0:1> and the fuse signals FUS<0:3>. In the normal mode, the signals S<0:3> is output as the same phase as that of the fuse signals FUS<0:3. In the test mode, the signals S<0:3> are output as an opposite phase to that of the fuse signals FUS<0:3>.

A refresh cycle signal generation circuit 80 compares the divider signals RCA<0:3> and the output signals S<0:3> of the adder according to a delayed refresh signal SREDD, and outputs the refresh cycle signal PSRF as a high level at a rising edge of the signal JDG when the divider signals RCA<0:3> and the output signals S<0:3> of the adder are the same.

Figure 2:
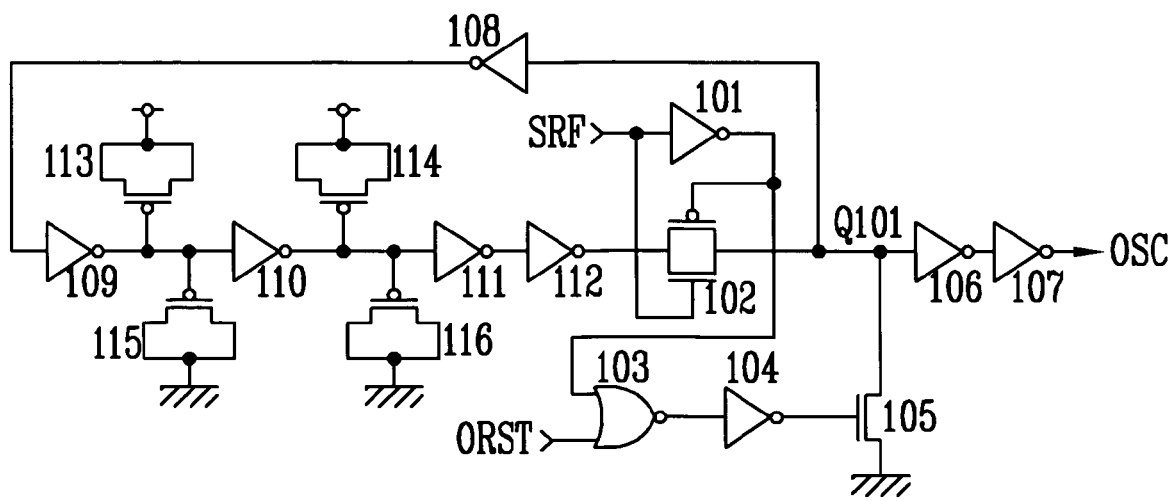
FIG. 2 is a detailed circuit diagram of the oscillation signal generation circuit that constitutes the circuit for controlling the refresh oscillator according to an embodiment of the present invention.

FIG. 2 is a detailed circuit diagram of the oscillation signal generation circuit that constitutes the circuit for controlling the refresh oscillator according to an embodiment of the present invention.

An inverter 101 inverts the refresh signal SRF. A transfer gate 102 transfers an output signal of an inverter 112 to a node Q101 according to the refresh signal SRF and the output signal of the inverter 101. A NOR gate 103 performs a NOR operation on the output signal of the inverter 101 and the second reset signal ORST. An inverter 104 inverts the output signal of the NOR gate 103. A NMOS transistor 105 is connected between the node Q101 and a ground terminal Vss, and controls the voltage level of the node Q101 according to the output signal of the inverter 104. Inverters 106 and 107 buffer the voltage of the node Q101, and outputs the oscillation signal OSC. Inverters 108 to 112 delay and invert the voltage of the node Q101. Meanwhile, capacitors 113 and 114 are connected between the inverter 109 and the inverter 110 to control the delay time. The capacitors 115 and 116 are connected between the inverters 111 and 112 to control the delay time.

A method of driving the oscillation signal generation circuit constructed above will now be described.

Before a refresh command is applied externally, the refresh signal SRF is applied as a low level, and the second reset signal ORST is applied as a low level. The refresh signal SRF applied as the low level is inverted to a high level through the inverter 101. The transfer gate 102 is thus turned off. The NOR gate 103 that receives the output signal of the high level of the inverter 101 and the second reset signal ORST of the low level outputs a signal of a low level. The output signal of the NOR gate 103 is inverted to a high level through the inverter 104, thus causing the NMOS transistor 105 to turn on. Accordingly, the node Q101 becomes a low level, and the oscillation signal OSC of a low level is output through the inverters 106 and 107. Meanwhile, the voltage of the low level of the node Q101 is delayed and inverted through the inverters 108 to 112, and thus becomes a high level. Since the transfer gate 102 keeps turned off, however, the output signal of the inverter 112 is not transmitted to the node Q101.

In this state, of the refresh command is input from the outside and the refresh signal SRF is applied as a high level, the refresh signal SRF is inverted to a low level through the inverter 101, and the transfer gate 102 is thus turned on. Furthermore, the NOR gate 103 has received the output signal of a low level of the inverter 101 and the second reset signal ORST of a low level outputs a signal of a high level. The output signal of the NOR gate 103 is inverted to a low level by means of the inverter 104, thus causing the NMOS transistor 105 to turn off. Accordingly, the output signal of the inverter 112, which keeps a high level, is transferred to the node Q101 through the transfer gate 102. The voltage of the node Q101 is buffered through the inverters 106 and 107, and is then output as the oscillation signal OSC of the high level. Meanwhile, the voltage of the high level of the node Q101 is delayed and inverted through the inverters 108 to 112, and thus becomes a low level. The voltage of the low level is transferred to the node Q101 through the transfer gate 102, and then output as the oscillation signal OSC of the low level.

As described above, the oscillation signal generation circuit outputs the oscillation signal OSC whose level is changed using the delay time through the inverters 108 to 112 as a cycle while the refresh signal SRF is applied as a high level.

Figure 3:
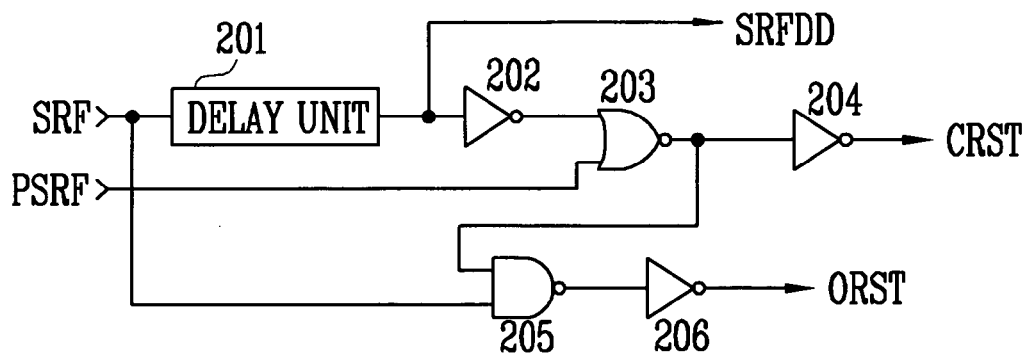
FIG. 3 is a detailed circuit diagram of the reset circuit that constitutes the circuit for controlling the refresh oscillator according to an embodiment of the present invention.

FIG. 3 is a detailed circuit diagram of the reset circuit that constitutes the circuit for controlling the refresh oscillator according to an embodiment of the present invention.

A refresh signal SRF is delayed by a delay unit 201, and thus becomes a delay signal SRFDD. An inverter 202 inverts the output signal of the delay unit 201, and a NOR gate 203 performs a NOR operation on the output signal of the inverter 202 and a refresh cycle signal PSRF. An inverter 204 inverts the output signal of the NOR gate 203 and outputs a first reset signal CRST. A NAND gate 205 performs a NAND operation on the first reset signal CRST and the refresh signal SRF, and an inverter 206 inverts the output signal of the NAND gate 205 and outputs a second reset signal ORST.

A driving method of the reset circuit constructed above will be below described.

If a refresh command is input and the refresh signal SRF is thus applied as a high level, after a delay time of the delay unit 201, the delay signal SRFDD is output as a high level. The output signal of the delay unit 201 is inverted to a low level by means of the inverter 202, and is then input to the NOR gate 203. The NOR gate 203 receives the output signal of the low level of the inverter 202 and the refresh cycle signal PSRF of the low level, and outputs a signal of a high level. The signal of the high level of the NOR gate 203 is inverted by the inverter 204, and the first reset signal CRST of a low level is thus output. At this time, the NAND gate 205 uses the first reset signal CRST of the low level and the refresh signal SRF of the high level to output a signal of a high level. The signal of a high level is inverted by the inverter 206, and the second reset signal ORST of a low level is thus output.

If the refresh cycle signal PSRF is applied as a high pulse while the refresh signal SRF is applied as a high level, the NOR gate 203 receives the output signal of the low level of the inverter 202 and the refresh cycle signal PSRF of the high level to output a signal of a low level. The signal of the low level is inverted by the inverter 204, and the first reset signal CRST of a high level is thus output. At this time, the NAND gate 205 receives the first reset signal CRST of the high level and the refresh signal SRF of the high level, and outputs a signal of a low level. The signal of the low level is inverted by the inverter 206, and the second reset signal ORST of a high level is thus output.

As described above, the reset circuit uses the refresh signal SRF and the refresh cycle signal PSRF to output the first reset signal CRST and the second reset signal ORST. Whenever the refresh signal SRF is applied as a high level and the refresh cycle signal PSRF is applied as a pulse of a high level, the reset circuit outputs the first reset signal CRST and the second reset signal ORST as a pulse of a high level.

Figure 4:
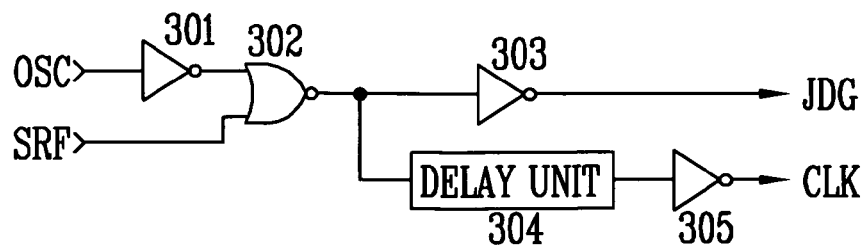
FIG. 4 is a detailed circuit diagram of the clock signal generation circuit that constitutes the circuit for controlling the refresh oscillator according to an embodiment of the present invention.

FIG. 4 is a detailed circuit diagram of the clock signal generation circuit that constitutes the circuit for controlling the refresh oscillator according to an embodiment of the present invention.

An inverter 301 inverts an oscillation signal OSC. A NAND gate 302 performs a NAND operation on the output signal of the inverter 301 and a refresh signal SRF. An inverter 303 inverts the output signal of the NAND gate 302, and outputs a signal JDG. The output signal of the NAND gate 302 is delayed for a predetermined time through a delay unit 304, inverted through an inverter 305, and then output as a clock signal CLK. The clock signal CLK is used as a control signal of a divider.

A driving method of the clock signal generation circuit constructed above will now be described.

A first oscillation signal OSC is inverted by the inverter 301, and the output signal of the inverter 301 is input to the NAND gate 302 together with the refresh signal SRF. Accordingly, since the refresh signal SRF is input as a high level, the NAND gate 302 outputs a signal of a low level if the oscillation signal OSC is input as a high level, and outputs a signal of a high level if the oscillation signal OSC is input as a low level. As an inverted signal of the output signal of the NAND gate 302, which is inverted by the inverter 303, is the signal JDG, the signal JDG is output as a high level if the oscillation signal OSC is input as a high level, and is output as a low level if the oscillation signal OSC is input as a low level. That is, the signal JDG can be a signal that has the same phase as that of the oscillation signal OSC.

Meanwhile, the clock signal CLK is a signal, which is delayed from the output signal of the NAND gate 302 through the delay unit 304 and is inverted by the inverter 305. Accordingly, the clock signal CLK is output as a high level if the oscillation signal OSC is input as a high level, and is output as a low level if the oscillation signal OSC is input as a low level. That is, the clock signal CLK is a signal, which is delayed from the oscillation signal OSC according to the delay time of the delay unit 304 and has an opposite phase to that of the oscillation signal OSC.

Figure 5:
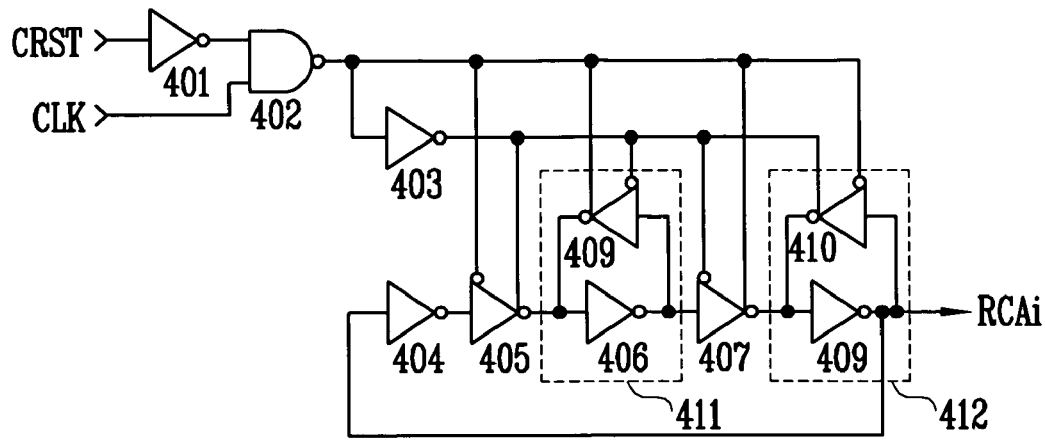
FIG. 5 is a detailed circuit diagram of the divider circuit that constitutes the circuit for controlling the refresh oscillator according to an embodiment of the present invention.

FIG. 5 is a detailed circuit diagram of the divider circuit that constitutes the circuit for controlling the refresh oscillator according to an embodiment of the present invention.

An inverter 401 inverts a first reset signal CRST. A NAND gate 402 performs a NAND operation on the output signal of the inverter 401 and a clock signal CLK. The output signal of the NAND gate 402 is inverted through an inverter 403. The output signal of the NAND gate 402 and the output signal of the inverter 403 are used as control signals of inverters 405, 407, 409 and 410. That is, the inverters 405 and 407 operate when the output signal of the NAND gate 402 is a low level, and the inverters 409 and 410 operate when the output signal of the NAND gate 402 is a high level. Meanwhile, the divider signal RCAi is feedbacked, and is then output with its phase inverted for a delay time by the inverters 404 to 408. The inverters 406 and 409 constitute a latch 411, and the inverters 408 and 410 constitute a latch 412.

A driving method of the divider constructed above, which constitutes the circuit for controlling the refresh oscillator according to the present invention, will be below described.

Of a plurality of dividers, a first divider 41 receives a clock signal CLK having an opposite phase to that of the oscillation signal OSC. The remaining dividers from a second divider 42 receive a divider signal RCAi of a previous divider as the clock signal CLK. In this case, a driving method of the first divider 41 will be described as an example.

If the first reset signal CRST and the clock signal CLK are input as a low level, the first reset signal CRST of the low level is inverted to a high level by the inverter 401. The first reset signal CRST of the high level is input to the NAND gate 402 together with the clock signal CLK of the low level. Thus, the NAND gate 402 outputs a signal of a high level. The output signal of the high level of the NAND gate 402 is inverted to a low level by means of the inverter 403. Accordingly, the inverters 405 and 410 are turned off, and the inverters 407 and 409 are turned on. As a result, the output signal RCAi keeps low since data stored in the latch 411 keeps a level output through the inverters 407 and 408.

If the first reset signal CRST and the clock signal CLK are input as a high level, the first reset signal CRST of the high level is inverted to a low level by means of the inverter 401. The first reset signal CRST of the low level is input to the NAND gate 402 together with the clock signal CLK of the high level. Thus, the NAND gate 402 outputs a signal of a high level. The output signal of the high level of the NAND gate 402 is inverted to a low level by means of the inverter 403. Accordingly, the inverters 405 and 410 are turned off, and the inverters 407 and 409 are turned on. As a result, the output signal RCAi keeps low since data stored in the latch 411 keeps a level output through the inverters 407 and 408.

If the first reset signal CRST is applied as a low level and the clock signal CLK is applied as a high level, the first reset signal CRST of the low level is inverted to a high level by means of the inverter 401. The first reset signal CRST of the high level is input to the NAND gate 402 together with the clock signal CLK of the high level, and the NAND gate 402 outputs a signal of a low level. The output signal of the low level of the NAND gate 402 is inverted to a high level by means of the inverter 403. Thus, the inverters 405 and 410 are turned on, and the inverters 407 and 409 are turned off. Accordingly, the divider signal RCAi keeps low, and inverted to a high level through the inverters 404, 405 and 406. However, the latch 411 maintains data of a high level since the inverter 407 keeps turned off.

If the first reset signal CRST and the clock signal CLK are input as a low level, the first reset signal CRST of the low level is inverted to a high level by the inverter 401. The first reset signal CRST of the high level is input to the NAND gate 402 together with the clock signal CLK of the low level. Thus, the NAND gate 402 outputs a signal of a high level. The output signal of the high level of the NAND gate 402 is inverted to a low level by means of the inverter 403. Accordingly, the divider signal RCAi keeps high because data of a high level, which are stored in the latch 411, keep a state output through the inverters 407 and 408.

As described above, the divider outputs data stored in the latches 411 and 412 as the divider signal RCAi of one cycle according to two cycles of the clock signal CLK. Accordingly, the first divider 41 outputs the divider signal RCA1 of one cycle in two cycles of the clock signal CLK. The second divider 42 outputs the divider signal RCA<1> of one cycle according to two cycles of the output signal RCA<0> of the first divider 41. The third divider 43 outputs the divider signal RCA<2> of one cycle according to cycles of the output signal RCA<1> of the second divider 42. That is, the first divider 41 outputs the divider signal RCA<0> of one cycle in two cycles of the clock signal CLK. The second divider 42 outputs the divider signal RCA<1> of one cycle in four cycles of the clock signal CLK. The third divider 43 outputs the divider signal RCA<2> of one cycle in eight cycles of the clock signal CLK.

Figure 6:
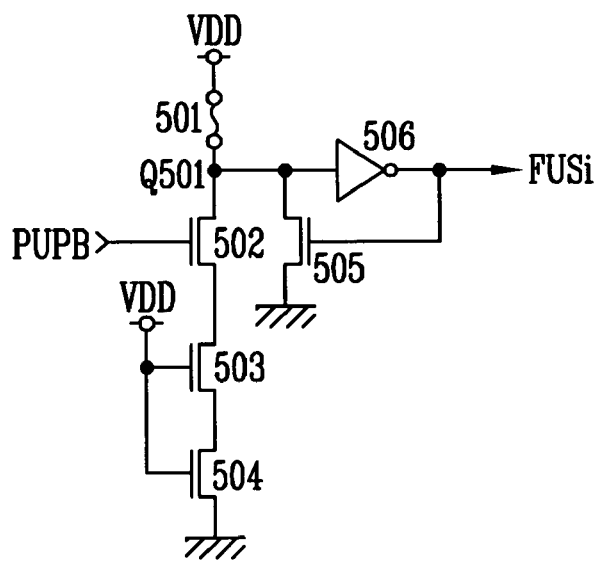
FIG. 6 is a detailed circuit diagram of the fuse set circuit that constitutes the circuit for controlling the refresh oscillator according to an embodiment of the present invention.

FIG. 6 is a detailed circuit diagram of the fuse set circuit that constitutes the circuit for controlling the refresh oscillator according to an embodiment of the present invention.

A fuse 501 is connected between a power supply terminal VDD and a node Q501. NMOS transistors 502, 503 and 504 is connected between the node Q501 and a ground terminal VSS in a serial manner. The NMOS transistor 502 operates according to a power-up signal PUPB, and the NMOS transistors 503 and 504 operate according to the power supply voltage VDD. A NMOS transistor 505 is connected to the NMOS transistors 502, 503 and 504, which are serially connected between the node Q501 and the ground terminal VSS, and is driven according to a voltage level of the output terminal FUSi. The voltage level of the node Q501 is inverted through an inverter 506, and thus becomes a voltage level of an output terminal FUSi. At this time, the power-up signal PUPB is a signal that becomes a low level if being applied with power.

The fuse set circuit constructed above outputs the fuse signal FUSi of a low level if the power-up signal PUPB is applied as a low level and the fuse 501 keeps connected, but outputs the fuse signal FUSi of a high level if the fuse 501 keeps disconnected.

Figure 7:
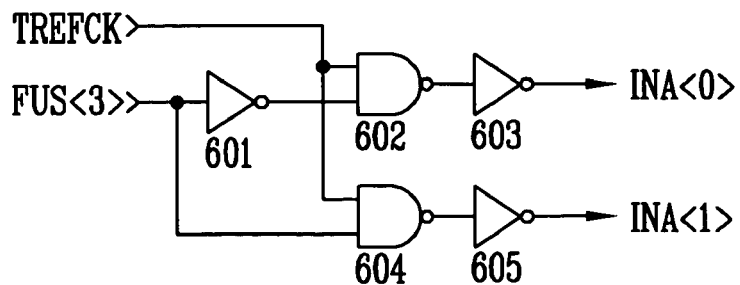
FIG. 7 is a detailed circuit diagram of the adder control circuit that constitutes the circuit for controlling the refresh oscillator according to an embodiment of the present invention.

FIG. 7 is a detailed circuit diagram of the adder control circuit that constitutes the circuit for controlling the refresh oscillator according to an embodiment of the present invention.

An inverter 601 inverts a fuse signal FUS<3> from the fuse set circuit 50. A NAND gate 602 performs a NAND operation on a test mode enable signal TREFCK, which is applied as a low level in the normal mode, but applied as a high level in the test mode, and the output signal of the inverter 601. An inverter 603 inverts the output signal of the NAND gate 602, and outputs an adder control signal INA<0>. A NAND gate 604 performs a NAND operation on the test mode enable signal TREFCK and the fuse signal FUS<3>. An inverter 605 inverts the output signal of the NAND gate 604, and outputs an adder control signal INA<1>.

A driving method of the adder control circuit constructed above will be below described.

In the normal mode, the test mode enable signal TREFCK is applied as a low level. The NAND gate 602 receives the test mode enable signal TREFCK of the low level and the fuse signal FUS<3>, which is inverted to a high level through the inverter 601, and outputs a signal of a high level. The signal is inverted by the inverter 603, and the adder control signal INA<0> of a low level is thus output. Meanwhile, the NAND gate 604 performs the test mode enable signal TREFCK of the low level and the fuse signal FUS<3> of the low level, and outputs a signal of a high level. The signal is inverted by the inverter 604, and the adder control signal INA<1> of a low level is thus output.

In the test mode, the test mode enable signal TREFCK is applied as a high level. The NAND gate 602 receives the test mode enable signal TREFCK of the high level and the fuse signal FUS<3>, which is inverted to a high level through the inverter 601, and outputs a signal of a low level. The signal is inverted by the inverter 603, and the adder control signal INA<0> of a high level is thus output. Meanwhile, the NAND gate 604 performs the test mode enable signal TREFCK of the high level and the fuse signal FUS<3> of the low level, and outputs a signal of a high level. The signal is inverted by the inverter 604, and the adder control signal INA<1> of a low level is thus output.

As described above, the adder control circuit outputs the adder control signals INA<0:1> of a low level regardless of the fuse signal FUS<3> if the test mode enable signal TREFCK is applied as a low level in the normal mode, and outputs the adder control signal INA<0> having an opposite phase to the fuse signal FUS<3> and the adder control signal INA<1> having the same phase as the fuse signal FUS<3> if the test mode enable signal TREFCK is applied as a high level in the test mode.

Figure 8:
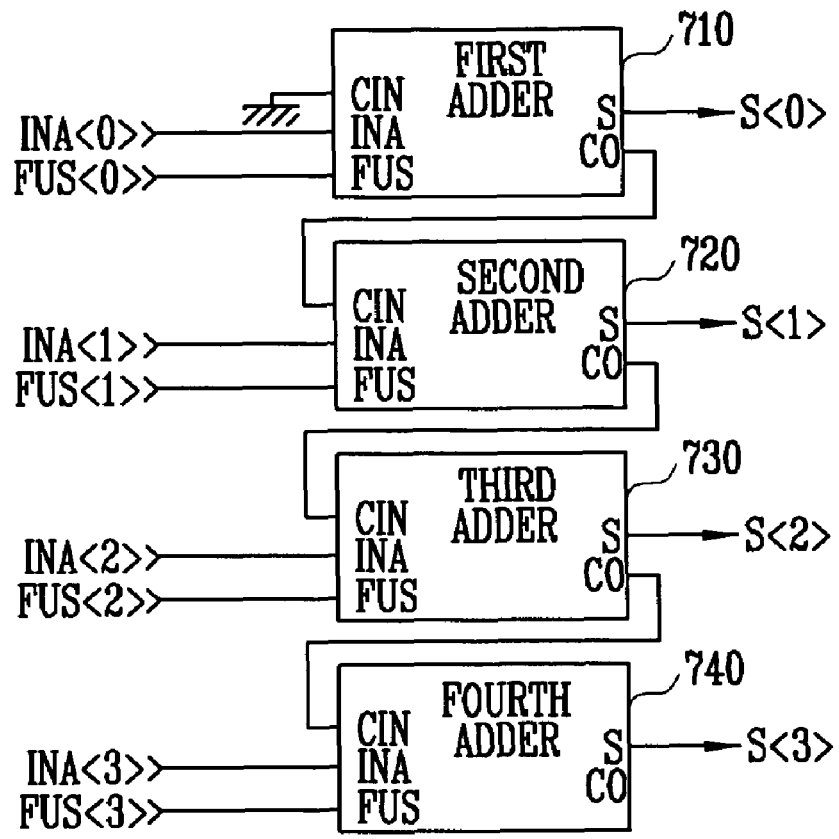
FIG. 8 is a detailed circuit diagram of the adder constituting the circuit for controlling the refresh oscillator according to an embodiment of the present invention.

FIG. 8 is a detailed circuit diagram of the adder constituting the circuit for controlling the refresh oscillator according to an embodiment of the present invention. A 4-bit full adder will be described as an example.

A first adder 710 receives a fuse signal FUS<0> and an adder control signal INA<0> and outputs a signal S0 and a signal CO. A second adder 720 receives an output signal CO of the first adder 710, a fuse signal FUS<1> and an adder control signal INA<1>, and outputs a signal S1 and the signal CO. A third adder 730 receives the output signal CO of the second adder 720, a fuse signal FUS<2> and an adder control signal INA<2>, and outputs a signal S2 and the signal CO. A fourth adder 740 receives the output signal CO of the third adder 730, a fuse signal FUS<3> and an adder control signal INA<3>, and outputs a signal S3 and a signal CO. However, the adder control signals INA<2:3> input to the third and fourth adders 730 and 740 are applied as a low level.

Figure 9:
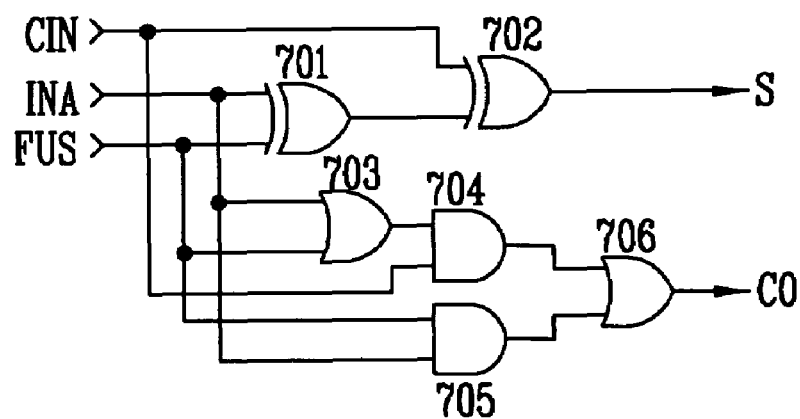
FIG. 9 shows a circuit diagram of FIG. 8.

FIG. 9 is a circuit diagram of a 1-bit adder constituting the 4-bit full adder.

An EOR gate 701 performs an EOR operation on a fuse signal FUS and an adder control signal INA. An EOR gate 702 performs an EOR operation on a signal CIN and the output signal of the EOR gate 701. At this time, the signal CIN is a signal that is input as a low level in case of the first adder 710, and is an output signal CO of the first to third adders 710 to 730 in case of the second to fourth adders 720 to 740. An OR gate 703 performs an OR operation on the fuse signal FUS and the adder control signal INA. An AND gate 704 performs an AND operation on the output signal of the OR gate 704 and the signal CIN. An AND gate 705 performs an AND operation on the fuse signal FUS and the adder control signal INA. An OR gate 706 performs an OR operation on the output signals of the AND gates 704 and 705.

A driving method of the 1-bit adder constructed above will now be described. At this time, it is assumed that the signal CIN is a low level.

In the normal mode, if the adder control signal INA is applied as a low level and the fuse signal FUS is applied as a low level, the EOR gate 701 outputs a signal of a low level. The EOR gate 702 performs an EOR operation on the output signal of the low level of the EOR gate 701 and the signal CIN of the low level, and outputs a signal S of a low level. Furthermore, the OR gate 703 performs an OR operation on the adder control signal INA of a low level and the fuse signal FUS of a low level, and outputs a signal of a low level. The AND gate 704 performs an AND operation on the output signal of the low level of the OR gate 703 and the signal CIN of the low level, and outputs a signal of a low level. The AND gate 705 performs an AND operation on the adder control signal INA and the fuse signal FUS of the low level, and outputs a signal of a low level. The OR gate 706 performs an OR operation on the output signals of the low level of the AND gates 704 and 705, and outputs the signal CO of a low level. Meanwhile, if the fuse signal FUS is a high level, the signal S is output as a high level, ad the signal CO is output as a low level.

In the test mode, if the adder control signal INA is applied as a high level and the fuse signal FUS is applied as a low level, the EOR gate 701 outputs a signal of a high level. The EOR gate 702 performs an EOR operation on the output signal of the high level of the EOR gate 701 and the signal CIN of the low level, and outputs a signal S of a high level. Furthermore, the OR gate 703 performs an OR operation on the adder control signal INA of a high level and the fuse signal FUS of the low level, and outputs a signal of a high level. The AND gate 704 performs an AND operation on the output signal of the high level of the OR gate 703 and the signal CIN of the low level, and outputs a signal of a low level. The AND gate 705 performs an AND operation on the adder control signal INA of the high level and the fuse signal FUS of the low level, and outputs a signal of a low level. The OR gate 706 performs an OR operation on the output signals of the low level of the AND gates 704 and 705, and outputs the signal CO of a low level. Meanwhile, if the fuse signal FUS is a high level, the signal S is output as a low level, ad the signal CO is output as a low level.

As described above, in the normal mode, if the test mode enable signal TREFCK is applied as a low level, the signal S is output as the level of the fuse signal FUS, but the signal CO is output as a low level regardless of the level of the fuse signal FUS. Furthermore, in the test mode, if the test mode enable signal TREFCK is applied as a high level, the signal S inverts the level of the fuse signal FUS, and the signal CO is output as a low level regardless of the level of the fuse signal FUS.

As described above, the 4-bit full adder shown in FIG. 8 has the division number set to 4. Thus, if the fuse signal FUS<2> is output as a high level, in the normal mode, the output signal SO of the first adder 710 is output as a low level, the output signal S1 of the second adder 720 is output as a low level, the output signal S3 of the third adder 730 is output as a high level, and the output signal S4 of the fourth adder 740 is output as a low level. In the test mode, however, the output signal SO of the first adder 710 is output as a high level, the output signal S1 of the second adder 720 is output as a low level, the output signal S3 of the third adder 730 is output as a high level, and the output signal S4 of the fourth adder 740 is output as a low level. Accordingly, in the test mode, the division number is increased by 1 compared to the normal mode.

Figure 10:
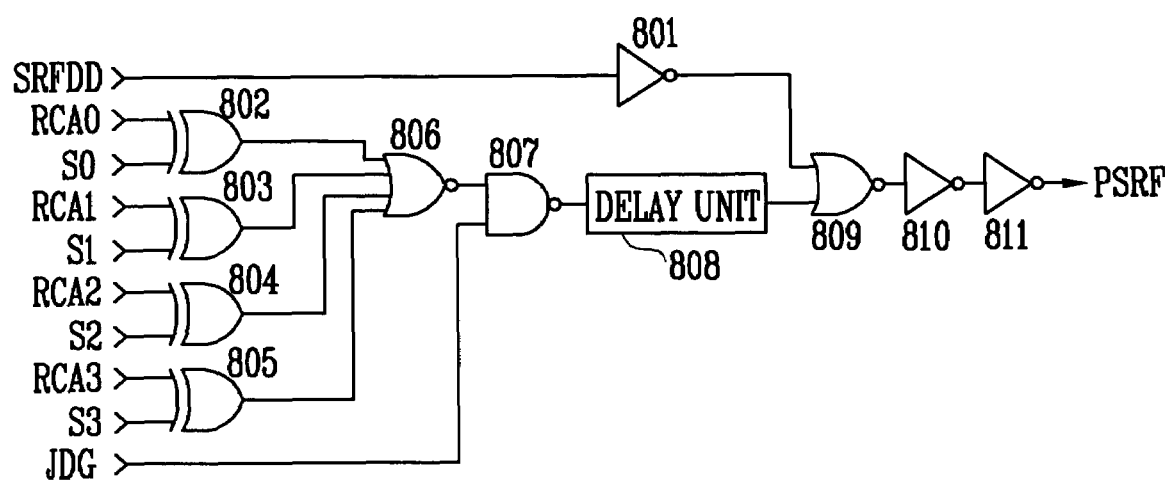
FIG. 10 is a detailed circuit diagram of the refresh cycle signal generation circuit that constitutes the circuit for controlling the refresh oscillator according to an embodiment of the present invention.

FIG. 10 is a detailed circuit diagram of the refresh cycle signal generation circuit that constitutes the circuit for controlling the refresh oscillator according to an embodiment of the present invention.

An inverter 801 inverts the delayed refresh signal SRFDD. EOR gates 802 to 805 perform an EOR operation on the output signals RCA<0:3> of the divider circuit 40 and the output signals S<0:3> of the adder, respectively. A NOR gate 806 perform an NOR operation on the output signals of the EOR gates 802 to 805. An NAND gate 807 perform an NAND operation on the output signal of the NOR gate 806 and a signal JDG. A delay unit 808 delays the output signal of the NAND gate 807. A NOR gate 809 perform a NOR operation on the output signal of the inverter 801 and the output signal of the delay unit 808. Inverters 810 and 811 buffer the output signal of the NOR gate 809, and outputs a refresh cycle signal PSRF.

In the refresh cycle signal generation circuit constructed above, the delayed refresh signal SREDD is applied as a high level. The EOR gates 802 to 805 compare the divider signals RCA<0:3> of the divider circuit 40 and the output signals S<0:3> of the adder. If the divider signals RCA<0:3> and the output signals S<0:3> of the adder are the same, the refresh cycle signal PSRF is output as a high level at a rising edge of the signal JDG. Therefore, if the division number is set to 4, and the fuse signal FUS<2> is output as a high level, the refresh cycle signal PSRF is output as the division number 4 in the normal mode, and the refresh cycle signal PSRF is output as the division number 5 in the test mode.

Figure 11:
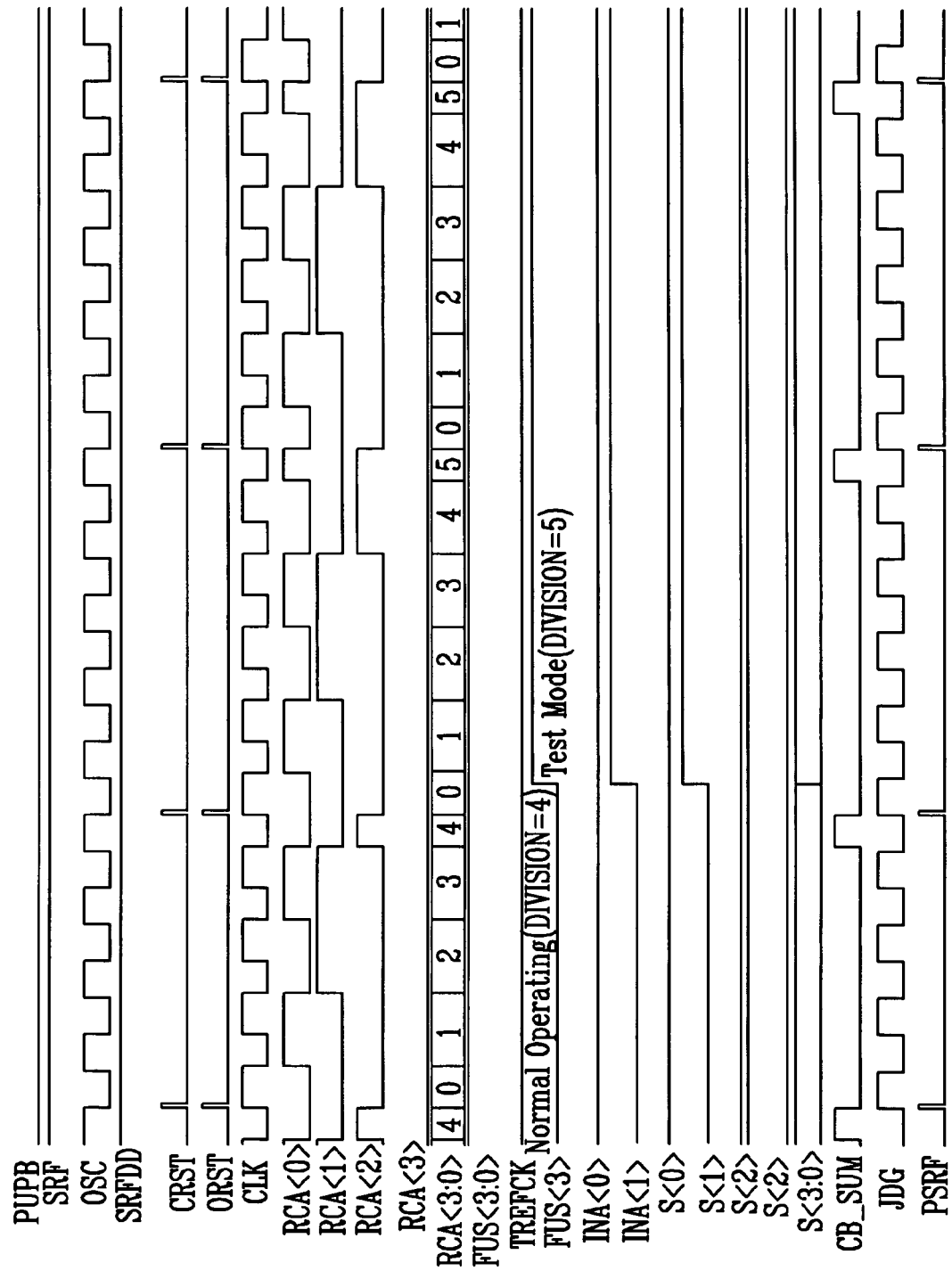
FIG. 11 shows an operational waveform in the case where the division number is 4 in the circuit for controlling the refresh oscillator according to an embodiment of the present invention.

The construction of the circuit for controlling the refresh oscillator and the driving method of each of the components according to the present invention have been described above. A method of driving the circuit for controlling the refresh oscillator will be below described with reference to an operational waveform when the division number of FIG. 11 is 4.

If a refresh command is input externally, a refresh signal SRF is generated internally and is then applied as a high level. The oscillation signal generation circuit 10 generates the oscillation signal OSC of a basic cycle, and the reset circuit 20 generates the delayed refresh signal SRFDD, according to the refresh signal SRF of the high level. Furthermore, the clock signal generation circuit 30 generates the signal JDG having the same phase as that of the oscillation signal OSC and the clock signal CLK having an opposite phase to that of the oscillation signal OSC, according to the refresh signal SRF and the oscillation signal OSC.

The divider circuit 40 counts the division numbers and generates the divider signals RCA<0:3>, according to the clock signal CLK. Meanwhile, if power is applied, the fuse signals FUS<0:3> are output from the fuse set circuit 50 according to the power-up signal PUPB applied as a low level. The fuse signals FUS<0:3> are output according to the number of set divisions. In this case, it is assumed that the division number is set to 4, and the fuse signal FUS<2> is output as a high level. The fuse signals FUS<0:3> are input to the adder control circuit 60. The adder control circuit 60 outputs the adder control signals INA<0:1> of a low level regardless of the fuse signal FUS<3> in the normal mode, according to the test mode enable signal TREFCK. The 4-bit full adder 70 that receives the adder control signals INA<0:1> of the low level outputs the signals S<0:3> according to the fuse signals FUS<0:3> and the adder control signals INA<0:3>. In the normal mode, the signals S<0:3> are output as the level of the fuse signals FUS<0:3>. The refresh cycle signal generation circuit 80 compares the signals S<0:3> that are output as the levels of the fuse signals FUS<0:3> and the divider signals RCA<0:3> of the divider circuit 40. If the divider signal RCA<2> becomes identical to the fuse signal FUS<2>, the refresh cycle signal generation circuit 80 generates the refresh cycle signal PSRF having the division number, which is set at a rising edge of the signal JDG. The refresh oscillator operates according to the refresh cycle signal PSRF, so that refresh is performed. Meanwhile, the refresh cycle signal PSRF is input to the reset circuit 20 to generate the first and second reset signals CRST and ORST, so that the oscillation signal generation circuit 10 and the divider circuit 40 are reset, and division for a next refresh cycle signal is thus repeated.

If the test mode enable signal TREFCK is applied as high level in the test mode, however, the adder control circuit 60 outputs the adder control signal INA<0> having an opposite phase to that of the fuse signals FUS<0:3> and the adder control signal INA<1> having the same phase as that of the fuse signals FUS<0:3>. Accordingly, the adder control signals INA<0:1> are input to the adder 70 since the adder control signal INA<0> becomes a high level if the fuse signal FUS<3> are a low level and the adder control signal INA<1> becomes a low level if the fuse signal FUS<3> is a high level, according to the division number set in the fuse set circuit 50. Accordingly, in the present embodiment in which the division number is set to 4, the output signal SO of the first adder 710 is output as a high level, the output signal S1 of the second adder 720 is output as a low level, the output signal S3 of the third adder 730 is output as a high level, and the output signal S4 of the fourth adder 740 is output as a low level. The refresh cycle signal generation circuit 80 compares the signals S<0:3> of the above level and the divider signals RCA<0:3> of the divider circuit 40, and generates the refresh cycle signal PSRF as the division numbers, which has greater one than the division number set at a rising edge of the signal JDG if the divider signal RCA<0> and the signal S<0> and the divider signal RCA<2> and the signal S<2> are all become the same. The refresh cycle signal PSRF in this test mode is output as the division number, which is greater two than the division number that is set if the number of set division is 8 or more. Accordingly, since the refresh cycle signal PSRF is generated as the division number, which is greater 1 or 2 than the division number of the normal operation, the refresh characteristics of a chip can be tested with refresh margin as much as Δ tREF.

For reference, Table 1 shows the comparison results between the refresh cycle in the normal operation and the refresh cycle in the test operation according to the division number that is set according to the fuse signals FUS<0:3> of the fuse set circuit 50. From Table 1, it can be seen that the division number in the test operation is greater 1 or 2 than that in the normal operation.

divider 410, and the third divider 430 outputs the divider signal RCA<2> of one cycle according to two cycles of the output signal RCA<1> of the second divider 420.

A fuse set circuit 500 includes a fuse, and outputs fuse signals FUS<0:3> for deciding the refresh cycle according

TABLE 1

| | | | | Normal operation(TREF = "L") | | | | Test mode operation(TREF = "H") | | | | |
|---|---|---|---|---|---|---|---|---|---|---|---|---|
| | | | | | | S<0:3> | | | | S<0:3> | | |
| FUSE3 | FUSE2 | FUSE1 | FUSE0 | INA<1> | INA<0> | Division number | PSRF Cycle | INA<1> | INA<0> | Division number | PSRF Cycle | Remark |
| 0 | 0 | 1 | 0 | 0 | 0 | 2 | tOSCP * 2 | 0 | 1 | 3 | tOSCP * 3 | Normal |
| 0 | 0 | 1 | 1 | 0 | 0 | 3 | tOSCP * 3 | 0 | 1 | 4 | tOSCP * 4 | Division |
| 0 | 1 | 0 | 0 | 0 | 0 | 4 | tOSCP * 4 | 0 | 1 | 5 | tOSCP * 5 | number + 1 |
| 0 | 1 | 0 | 1 | 0 | 0 | 5 | tOSCP * 5 | 0 | 1 | 6 | tOSCP * 6 | |
| 0 | 1 | 1 | 0 | 0 | 0 | 6 | tOSCP * 6 | 0 | 1 | 7 | tOSCP * 7 | |
| 0 | 1 | 1 | 1 | 0 | 0 | 7 | tOSCP * 7 | 0 | 1 | 8 | tOSCP * 8 | |
| 1 | 0 | 0 | 0 | 0 | 0 | 8 | tOSCP * 8 | 1 | 0 | A | tOSCP * 10 | Normal |
| 1 | 0 | 0 | 1 | 0 | 0 | 9 | tOSCP * 9 | 1 | 0 | B | tOSCP * 11 | Division |
| 1 | 0 | 1 | 0 | 0 | 0 | A | tOSCP * 10 | 1 | 0 | C | tOSCP * 12 | number + 2 |
| 1 | 0 | 1 | 1 | 0 | 0 | B | tOSCP * 11 | 1 | 0 | D | tOSCP * 13 | |
| 1 | 1 | 0 | 0 | 0 | 0 | C | tOSCP * 12 | 1 | 0 | E | tOSCP * 14 | |
| 1 | 1 | 0 | 1 | 0 | 0 | D | tOSCP * 13 | 1 | 0 | F | tOSCP * 15 | |

Figure 12:
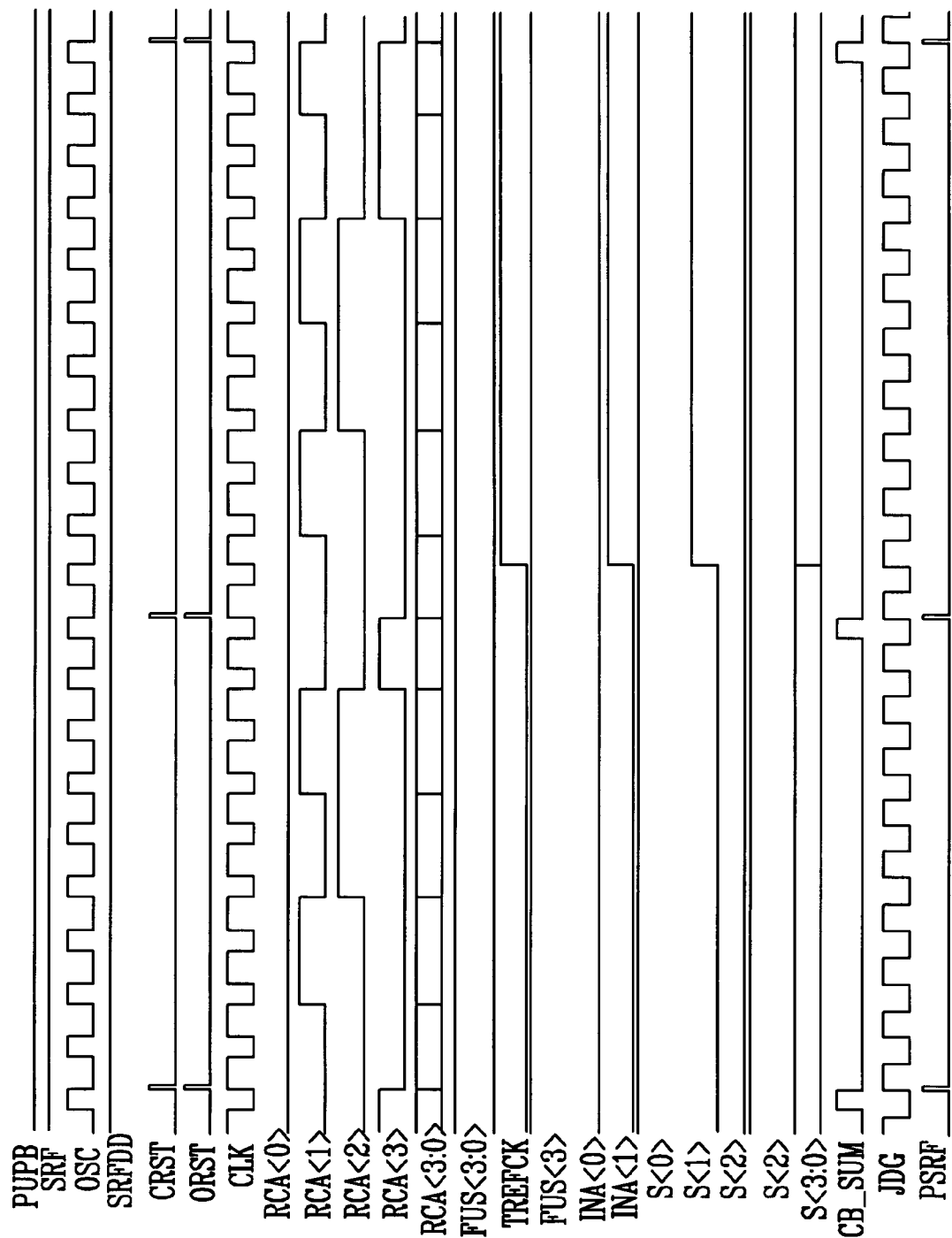
FIG. 12 shows an operational waveform in the case where the division number is 9 in the circuit for controlling the refresh oscillator according to an embodiment of the present invention.

Meanwhile, FIG. 12 shows an operational waveform in the case where the division number is 9 in the circuit for controlling the refresh oscillator according to an embodiment of the present invention.

Figure 13:
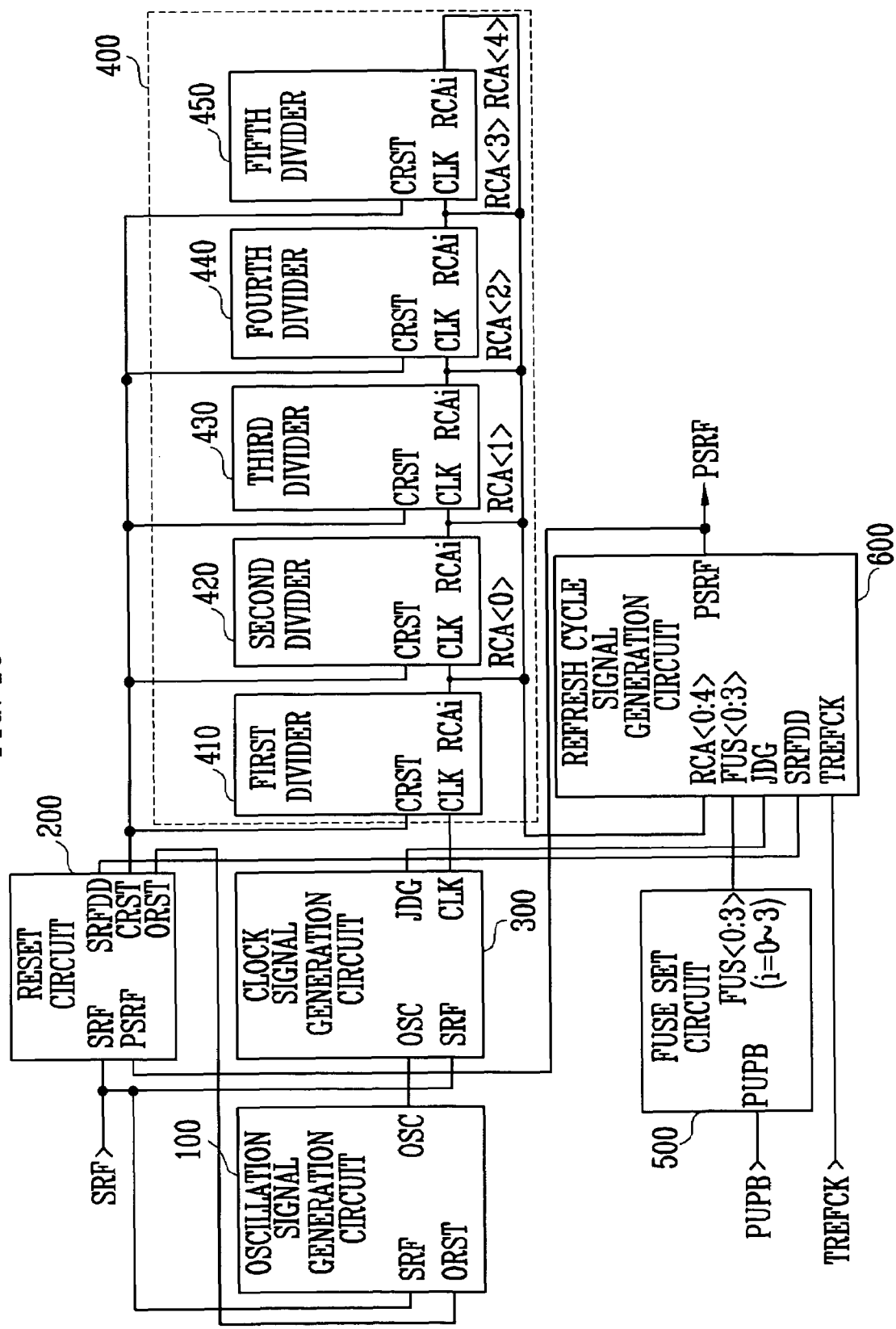
FIG. 13 is a block diagram of a circuit for controlling a refresh oscillator according to another embodiment of the present invention.

FIG. 13 is a block diagram of a circuit for controlling a refresh oscillator according to another embodiment of the present invention.

An oscillation signal generation circuit 100 generates an oscillation signal OSC according to a basic refresh cycle if a refresh command is applied from the outside and a refresh signal SRF is generated. The oscillation signal OSC is output with its level changed using an internal delay time of the oscillation signal generation circuit 100 as a cycle.

A reset circuit 200 uses the refresh signal SRF and a refresh cycle signal PSRF to generate a delay signal SRFDD of a refresh signal, a first reset signal CRST and a second reset signal ORST. Whenever the refresh signal SRF is applied as a high level and the refresh cycle signal PSRF is applied as a pulse of a high level, the reset circuit 200 outputs the first reset signal CRST and the second reset signal ORST of a high level. At this time, the first reset signal CRST initializes dividers 410 to 450 of a divider circuit 400, and the second reset signal CRST initializes the oscillation signal generation circuit 100.

A clock signal generation circuit 300 generates a signal JDG having the same phase as that of the oscillation signal OSC and a clock signal CLK having an opposite phase to that of the oscillation signal OSC according to the refresh signal SRF and the oscillation signal OSC.

A divider circuit 400 is initialized according to the first reset signal CRST, and generates divider signals RCA<0:4> according to the clock signal CLK. The divider circuit 400 is comprised of first to firth dividers 410 to 450, which is greater than that of the embodiment, which has been described with reference to FIG. 1. The first to fifth dividers 410 to 450 output the divider signals RCA<0:4> that increase in a sequential manner. That is, the first divider 410 outputs the divider signal RCA<0> of one cycle according to two cycles of the clock signal CLK, the second divider 420 outputs the divider signal RCA<1> of one cycle according to two cycles of the output signal RCA<0> of the first to a power-up signal PUPB and a cutting state of the fuse. For example, if the fuse signal FUS<0> is a high level, the refresh cycle can be set to 1 division. If the fuse signal FUS<1> is a high level, the refresh cycle can be set to 2 division. If the fuse signal FUS<2> is a high level, the refresh cycle can be set to 4 division. If the fuse signal FUS<3> is a high level, the refresh cycle can be set to 8 division. A greater number of divisions can be set according to the output combination of the fuse signals FUS<0:3>.

A refresh cycle signal generation circuit 600 compares a test mode enable signal TREFCK and the divider signal RCA<0> according to the delayed refresh signal SREDD. If the divider signals RCA<1:4> and the fuse signals FUS<0:3> are the same as a result of comparing the divider signals RCA<1:4> and the fuse signals FUS<0:3>, respectively, the refresh cycle signal generation circuit 600 outputs a refresh cycle signal PSRF as a high level at a rising edge of a signal JDG.

Figure 14:
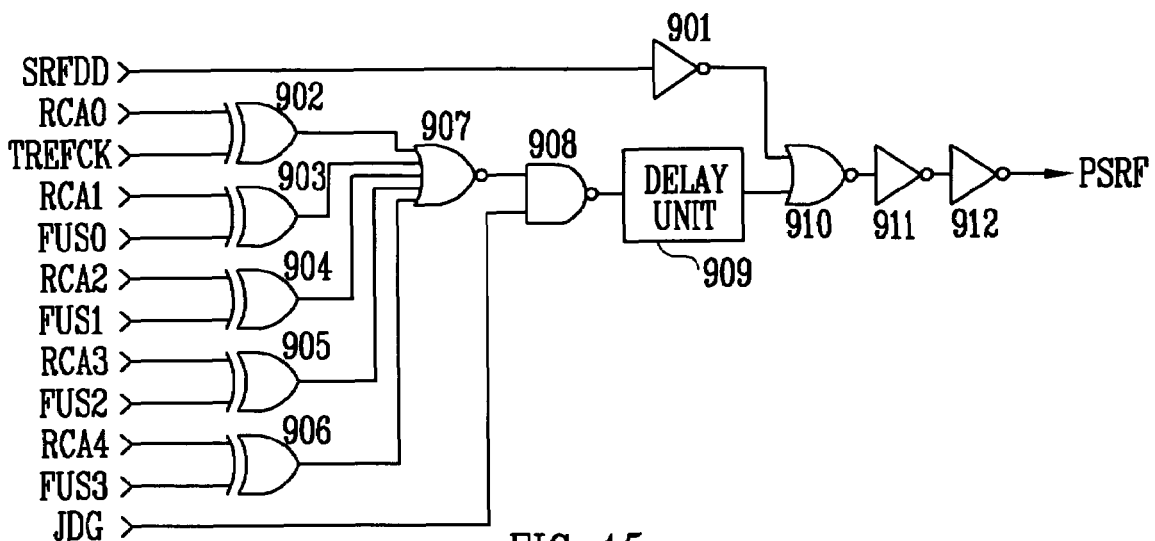
FIG. 14 is a detailed circuit diagram of the refresh cycle signal generation circuit that constitutes the circuit for controlling the refresh oscillator according to an embodiment of the present invention.
Figure 15:
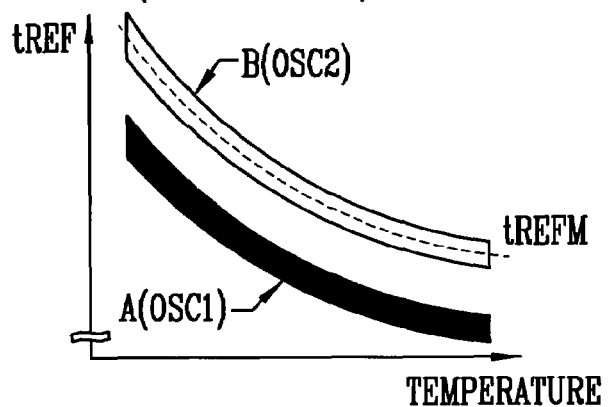
FIG. 15 is a graph illustrating a refresh time of a chip depending upon variation in temperature in the prior art.
Figure 16:
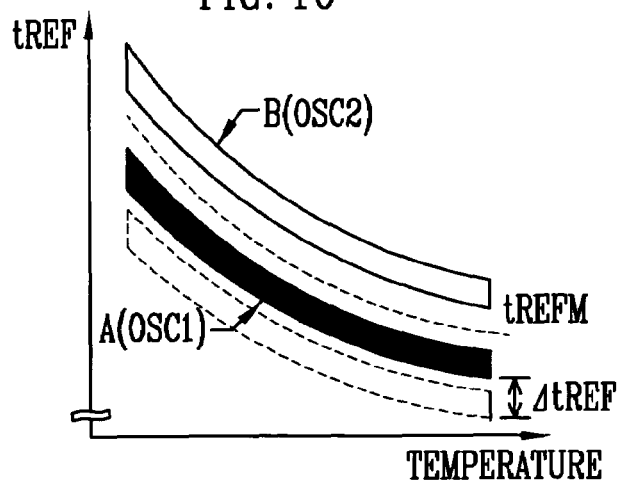
FIG. 16 is a graph illustrating a refresh time of a chip depending upon variation in temperature according to the present invention.
Figure 17:
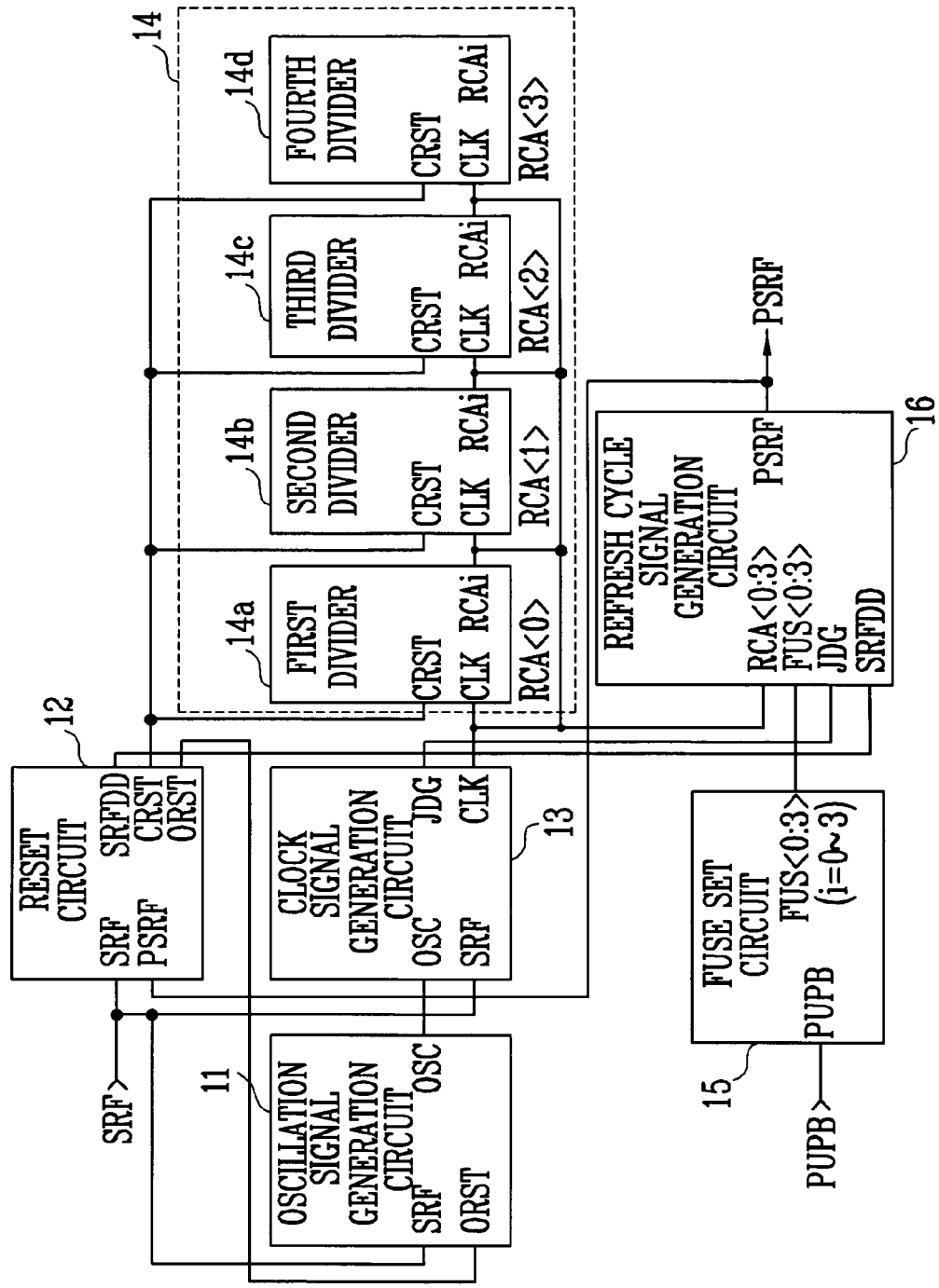
FIG. 17 shows a circuit for controlling a refresh oscillator in the prior art.

FIG. 14 is a detailed circuit diagram of the refresh cycle signal generation circuit that constitutes the circuit for controlling the refresh oscillator according to an embodiment of the present invention.

An inverter 901 inverts the delayed refresh signal SRFDD. An EOR gate 902 performs an EOR operation on the divider signal RCA<0> and the test mode enable signal TREFCK. EOR gates 903 to 906 perform an EOR operation on the divider signals RCA<1:4> and the fuse signals FUS<0:3>, respectively. An NOR gate 907 performs an NOR operation on the output signals of the EOR gates 902 to 906. An NAND gate 908 performs an NAND operation on the output signal of the NOR gate 907 and the signal JDG. A delay unit 909 delays the output signal of the NAND gate 908. An NOR gate 910 performs an NOR operation on the output signal of the inverter 901 and the output signal of the delay unit 909. Inverters 911 and 912 buffer the output signal of the NOR gate 910, and outputs a refresh cycle signal PSRF.

In the refresh cycle signal generation circuit constructed above, the delayed refresh signal SREDD is applied as a high level. The EOR gates 903 to 906 compare the divider signal RCA<0> and the test mode enable signal TREFCK, and the divider signals RCA<1:4> and the fuse signals FUS<0:3>. If the divider signals RCA<1:4> and the fuse signals FUS<0:3> are different from each other as a result of the comparison, the EOR gates 903 to 906 output the refresh cycle signal PSRF as a high level at a rising edge of the signal JDG. Accordingly, if the division number is set to 4 and the fuse signal FUS<2> is thus output as a high level, the refresh cycle signal PSRF is output as a division number 4 in the normal mode in which the test mode enable signal TREFCK is applied as a low level. In the test mode in which the test mode enable signal TREFCK is applied as a high level, if the fuse signal FUS<2> is output as a high level, the refresh cycle signal PSRF is output as a division number 5. That is, in the test mode, the refresh cycle time is 0.5*T greater than the refresh cycle of the normal mode.

For reference, Table 2 shows the comparison results between the refresh cycle in the normal operation and the refresh cycle in the test operation according to the division number that is set according to the fuse signals FUS<0:3> of the fuse set circuit 500. From Table 2, it can be seen that the refresh cycle in the test operation is 0.5*T greater than that in the normal operation.

As described above, according to the present invention, by changing a refresh cycle in a user test mode, refresh characteristics occurring due to variation in a basic oscillator cycle depending upon variation in a process condition, an operating voltage, temperature, etc. can be tested in an efficient manner. Furthermore, predetermined margin is assigned to a defined division value by adding a circuit that can be controlled according to a set value to a fuse set circuit. It is thus possible to screen a chip so that it always has a predetermined margin.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A circuit for controlling a refresh oscillator circuit, comprising:

an oscillation signal generation circuit for generating an oscillation signal depending upon a basic oscillation cycle, according to a refresh signal generating when a refresh command is issued;

a clock signal generation circuit for generating a first clock signal having the same phase as that of the oscillation signal and a second clock signal having an opposite phase to that of the oscillation circuit, according to the refresh signal and the oscillation signal;

a divider circuit having a plurality of dividers, for sequentially counting a plurality of divider signals, and generating the divider signals that increases in a sequential manner, according to the second clock signal;

a fuse set circuit having a fuse, for generating a plurality of fuse signals for deciding a refresh cycle, according to a cutting state of the fuse;

a control circuit for outputting a control signal depending upon the fuse signals, according to a test mode enable signal;

an adder for outputting a plurality of output signals depending upon the fuse signals, according to the control signal; and a refresh cycle signal generation circuit for comparing the plurality of the divider signals and the plurality of the output signals of the adder, respectively, and if the divider signals and the output signals of the adder are the same, generating a refresh cycle signal whenever the first control signal is generated.

2. The circuit as claimed in claim 1, further comprising a reset circuit, which is enabled according to the refresh signal, and generates a first reset signal for initializing the divider circuit and a second reset signal for initializing the oscillation signal generation circuit whenever the refresh cycle signal is applied.

3. The circuit as claimed in claim 2, wherein the oscillation signal generation circuit is initialized according to the second reset signal, and generates the oscillation signal whose level is changed using an internal signal delay time as a cycle, according to the refresh signal.

4. The circuit as claimed in claim 2, wherein the divider circuit includes a plurality of dividers that are initialized according to the first reset signal, and sequentially counts the plurality of the divider signals and generates the plurality of the divider signals that increase sequentially, according to the second clock signal.

5. The circuit as claimed in claim 1, wherein the control circuit outputs first and second control signals of a low level regardless of the fuse signals in a normal mode in which the test mode enable signal is disabled, and outputs the first control signal having an opposite phase as that of the fuse

TABLE 2

| | | | | Normal operation(TREF = "L") | | Test mode operation(TREF = "H") | | | |
|---|---|---|---|---|---|---|---|---|---|
| FUSE3 | FUSE2 | FUSE1 | FUSE0 | S<0:3> Division number | PSRF Cycle | S<0:3> Division number | PSRF Cycle (OSC = T/2) | | Remark |
| 0 | 0 | 1 | 0 | 2 | tOSCP * 4 | 2 | tOSCP * 5 | T * 2.5 | Normal |
| 0 | 0 | 1 | 1 | 3 | tOSCP * 6 | 3 | tOSCP * 7 | T * 3.5 | Refresh + 0.5 * T |
| 0 | 1 | 0 | 0 | 4 | tOSCP * 8 | 4 | tOSCP * 9 | T * 4.5 | |
| 0 | 1 | 0 | 1 | 5 | tOSCP * 10 | 5 | tOSCP * 11 | T * 4.5 | |
| 0 | 1 | 1 | 0 | 6 | tOSCP * 12 | 6 | tOSCP * 13 | T * 6.5 | |
| 0 | 1 | 1 | 1 | 7 | tOSCP * 14 | 7 | tOSCP * 15 | T * 7.5 | |
| 1 | 0 | 0 | 0 | 8 | tOSCP * 16 | 8 | tOSCP * 17 | T * 8.5 | |
| 1 | 0 | 0 | 1 | 9 | tOSCP * 18 | 9 | tOSCP * 19 | T * 9.5 | |
| 1 | 0 | 1 | 0 | A | tOSCP * 20 | A | tOSCP * 21 | T * 10.5 | |
| 1 | 0 | 1 | 1 | B | tOSCP * 22 | B | tOSCP * 23 | T * 11.5 | |
| 1 | 1 | 0 | 0 | C | tOSCP * 24 | C | tOSCP * 25 | T * 12.5 | |
| 1 | 1 | 0 | 1 | D | tOSCP * 26 | D | tOSCP * 27 | T * 13.5 | | signals and the second control signal having the same phase as that of the fuse signals in a test mode in which the test mode enable signal is enabled.

6. The circuit as claimed in claim 1, wherein the adder outputs the output signals having the same phase as that of the fuse signals in a normal mode, and outputs the output signals having an opposite phase to that of the fuse signals in a test mode.

7. The circuit as claimed in claim 1, wherein the refresh cycle signal generation circuit compares the plurality of the divider signals and the plurality of the output signals of the adder, respectively, in a test mode, and if the divider signals and the output signals of the adder are the same, generates a refresh cycle signal having a greater refresh cycle than that set by the fuse set circuit whenever the first control signal is generated.

8. The circuit as claimed in claim 1, wherein the refresh cycle signal generation circuit includes:
 a plurality of EOR gates for performing an EOR operation on the plurality of the divider signals and the plurality of the output signals of the adder, respectively;
 a first NOR gate for performing a NOR operation on the output signals of the plurality of the EOR gates;
 a NAND gate for performing a NAND operation on the output signal of the NOR gate and the first control signal; and
 a second NOR gate for performing a NOR operation on an inverted signal of the refresh signal and a delay signal of the output signal of the NAND gate to generate the refresh cycle signal.

9. A circuit for controlling a refresh oscillator circuit, comprising:
 an oscillation signal generation circuit for generating an oscillation signal depending upon a basic oscillation cycle, according to a refresh signal generating when a refresh command is issued;
 a clock signal generation circuit for generating a first clock signal having the same phase as that of the oscillation signal and a second clock signal having an opposite phase to that of the oscillation circuit, according to the refresh signal and the oscillation signal;
 a divider circuit having a plurality of dividers, for sequentially counting a plurality of divider signals, and generating the divider signals that increases in a sequential manner, according to the second clock signal;
 a fuse set circuit having a fuse, for generating a plurality of fuse signals for deciding a refresh cycle, according to a cutting state of the fuse; and
 a refresh cycle signal generation circuit for comparing a test mode enable signal and a fuse signal, and the plurality of the divider signals, respectively, and if the divider signals and the output signals of an adder are the same, generating a refresh cycle signal having a greater refresh cycle than that set by the fuse set circuit whenever the first control signal is generated in a test mode.

10. The circuit as claimed in claim 9, wherein the divider circuit generates the divider signals whose number is one greater than the number of the fuse signals of the fuse set circuit.

11. The circuit as claimed in claim 9, wherein the refresh cycle signal generation circuit includes:
 an first EOR gate for performing an EOR operation on the test mode enable signal and the divider signals;
 a plurality of second EOR gates for performing an EOR operation on the remaining divider signals and the fuse signals, respectively;
 a first NOR gate for performing a NOR operation on the output signals of the plurality of the EOR gates;
 a NAND gate for performing a NAND operation on the output signal of the NOR gate and the first control signal; and
 a second NOR gate for performing a NOR operation on an inverted signal of the refresh signal and a delay signal of the output signal of the NAND gate to generate the refresh cycle signal.

* * * * *